United States Patent
Chang et al.

(10) Patent No.: US 6,709,773 B1
(45) Date of Patent: Mar. 23, 2004

(54) MAGNETIC ANISOTROPHY OF SOFT-UNDERLAYER INDUCED BY SEEDLAYER

(75) Inventors: Chung-Hee Chang, Fremont, CA (US); Rajiv Y. Ranjan, San Jose, CA (US)

(73) Assignee: Seagate Technology, Inc., Scotts Valley, CA (US)

(*) Notice: Subject to any disclaimer, the term of this patent is extended or adjusted under 35 U.S.C. 154(b) by 0 days.

(21) Appl. No.: 09/873,314

(22) Filed: Jun. 5, 2001

Related U.S. Application Data (60) Provisional application No. 60/230,004, filed on Sep. 5, 2000.

(51) Int. Cl.[7] ............... G11B 5/66; G11B 5/70; C23C 14/34; B05D 5/12
(52) U.S. Cl. ............... 428/694 TS; 428/336; 428/694 TM; 428/900; 427/129; 427/131; 427/599; 204/192.15; 204/192.2; 360/97.01
(58) Field of Search ............... 428/694 TS, 694 TM, 428/900, 336, 65.3; 360/97.01; 427/129, 131, 599; 204/192.2, 192.15

(56) References Cited

U.S. PATENT DOCUMENTS

| | | | |
|---|---|---|---|
| 5,226,966 A | * 7/1993 | Mallary et al. | 118/623 |
| 5,589,262 A | 12/1996 | Kiuchi et al. | 428/336 |
| 5,700,593 A | 12/1997 | Okumura et al. | 428/694 TS |
| 5,815,342 A | 9/1998 | Akiyama et al. | 360/97.01 |
| 5,849,386 A | 12/1998 | Lal et al. | 428/65.3 |
| 5,858,566 A | 1/1999 | Zhang | 428/694 TS |
| 5,861,220 A | 1/1999 | Coughlin | 428/694 TM |
| 5,989,674 A | 11/1999 | Marinero et al. | 428/65.3 |
| 6,077,586 A | 6/2000 | Bian et al. | 428/65.3 |
| 6,125,019 A | 9/2000 | Hoshiya et al. | 360/324.1 |
| 6,143,388 A | 11/2000 | Bian et al. | 428/65.3 |
| 6,395,413 B1 | * 5/2002 | Ando | 428/694 T |
| 6,531,202 B1 | * 3/2003 | Litvinov et al. | 428/65.3 |
| 2002/0012816 A1 | * 1/2002 | Shimizu et al. | 428/694 TM |

FOREIGN PATENT DOCUMENTS

| | | | |
|---|---|---|---|
| JP | 5-258305 A | * 10/1993 | |
| JP | 6-180834 | * 6/1994 | |

OTHER PUBLICATIONS

E. J. Yun et al., "Complex anisotropies in sputtered Co90Fe10 alloy thin films", I/UCR Center for Magnetics, The University of Texas at Austin, Austin, TX, Nov. 3, 1995.
Li–Lien Lee et al., "Seed layer induced (002) crystallographic texture in NiAl underlayers", J. Appl. Phys. 79 (8), Apr. 15, 1996.
Ando et al. "triple–Layer Perpendicular Recording Media for High SN Ratio and Signal Stability" IEEE Transactions on Magnetics, vol. 33, No. 5, Sep. 1997, pp. 2983–2985.
Ando et al. "Effects of In–Plane Hard Magnetic Layer on Demagnetization and Media Noise in Triple–Layered Perpendicular Recording Media" IEICE Trans. Electron., vol. 78–C, No. 11, Nov. 1995, pp. 1543–1549.
Takahashi et al. "Annealing Dependence of Coercivity, Anisotrophy Field, and Resistivity for Amorphous CoZrNb Films Deposited by dc Planar Magnetron Sputtering" J. Appl. Phys. vol. 69, No. 8, Apr. 1991, pp. 5011–5013.
Nakagawa et al. "Improvement of Magnetic Properties and Crystallinity of Co–Cr/Ni–Fe Double–Layer with Very Thin Co79CR21 Underlayer" IEEE Transactions on Magnetics, vol. 26, No. 5, Sep. 1990, pp. 1608–1610.

* cited by examiner

Primary Examiner—Holly Rickman
(74) Attorney, Agent, or Firm—Morrison & Foerster LLP

(57) ABSTRACT

A perpendicular magnetic recording medium having a substrate, a seedlayer on the substrate and a magnetic underlayer on the seedlayer, the magnetic underlayer having an easy axis of magnetization substantially directed in a radial or transverse direction, and a process for manufacturing the perpendicular magnetic recording medium are disclosed.

20 Claims, 7 Drawing Sheets

← Protective overcoat 23

← Magnetic layer 22

← Underlayer 21

← Substrate 20

← Underlayer 21'

← Magnetic layer 22'

← Protective overcoat 23'

MAGNETIC ANISOTROPHY OF SOFT-UNDERLAYER INDUCED BY SEEDLAYER

RELATED APPLICATIONS

This application claims priority from Provisional Application Ser. No. 60/230,004 filed Sep. 5, 2000, entitled "Uniaxial Anisotropy of Soft-Underlayer Induced by Seedlayer," the entire disclosure of which is hereby incorporated herein by reference. This application is also related to the application entitled "Magnetic Anisotropy of Soft-Underlayer Induced by Magnetron Field," filed along with this application, the entire disclosure of which is hereby incorporated herein by reference.

FIELD OF INVENTION

This invention relates to perpendicular recording media, such as thin film magnetic recording disks having perpendicular recording, and to a method of manufacturing the media. The invention has particular applicability to high areal density magnetic recording media exhibiting low noise.

Background

The increasing demands for higher areal recording density impose increasingly greater demands on thin film magnetic recording media in terms of remanent coercivity (Hr), magnetic remanance (Mr), coercivity squareness (S*), medium noise, i.e., signal-to-medium noise ratio (SMNR), and narrow track recording performance. It is extremely difficult to produce a magnetic recording medium satisfying such demanding requirements.

The linear recording density can be increased by increasing the Hr of the magnetic recording medium, and by decreasing the medium noise, as by maintaining very fine magnetically non-coupled grains. Medium noise in thin films is a dominant factor restricting increased recording density of high-density magnetic hard disk drives, and is attributed primarily to inhomogeneous grain size and inter-granular exchange coupling. Accordingly, in order to increase linear density, medium noise must be minimized by suitable microstructure control.

According to the domain theory, a magnetic material is composed of a number of submicroscopic regions called domains. Each domain contains parallel atomic moments and is always magnetized to saturation, but the directions of magnetization of different domains are not necessarily parallel. In the absence of an applied magnetic field, adjacent domains may be oriented randomly in any number of several directions, called the directions of easy magnetization, which depend on the geometry of the crystal. The resultant effect of all these various directions of magnetization may be zero, as is the case with an unmagnetized specimen. When a magnetic filed is applied, the domains most nearly parallel to the direction of the applied field grow in size at the expense of the others. This is called boundary displacement of the domains or the domain growth. A further increase in magnetic field causes more domains to rotate and align parallel to the applied field. When the material reaches the point of saturation magnetization, no further domain growth would take place on increasing the strength of the magnetic field.

The ease of magnetization or demagnetization of a magnetic material depends on the crystal structure, grain orientation, the state of strain, and the direction and strength of the magnetic field. The magnetization is most easily obtained along the easy axis of magnetization but most difficult along the hard axis of magnetization. A magnetic material is said to possess a magnetic anisotropy when easy and hard axes exist. On the other hand, a magnetic material is said to be isotropic when there are no easy or hard axes.

"Anisotropy energy" is the difference in energy of magnetization for these two extreme directions, namely, the easy axis of magnetization and the hard axis of magnetization. For example, a single crystal of iron, which is made up of a cubic array of iron atoms, tends to magnetize in the directions of the cube edges along which lie the easy axes of magnetization. A single crystal of iron requires about $1.4 \times 10^5$ ergs/cm$^3$ (at room temperature) to move magnetization into the hard axis of magnetization, which is along a cubic body diagonal.

The anisotropy energy $U_A$ could be expressed in an ascending power series of the direction cosines between the magnetization and the crystal axes. For cubic crystals, the lowest-order terms take the form of Equation (1), $$U_A = K_1(\alpha_1^2\alpha_2^2 + \alpha_2^2\alpha_3^2 + \alpha_3^2\alpha_1^2) + K_2(\alpha_1^2\alpha_2^2\alpha_3^2) \quad (1)$$

where $\alpha_1$, $\alpha_2$ and $\alpha_3$ are direction cosines with respect to the cube, and $K_1$, and $K_2$ are temperature-dependent parameters characteristic of the material, called anisotropy constants.

Anisotropy constants can be determined from (1) analysis of magnetization curves, (2) the torque on single crystals in a large applied field, and (3) single crystal magnetic resonance.

The total energy of a magnetic substance depends upon the state of strain in the magnetic material and the direction of magnetization through three contributions. The first two consist of the crystalline anisotropy energy of the unstrained lattice plus a correction that takes into account the dependence of the anisotropy energy on the state of strain. The third contribution is that of the elastic energy, which is independent of magnetization direction and is a minimum in the unstrained state. The state of strain of the crystal will be that which makes the sum of the three contributions of the energy a minimum. The result is that, when magnetized, the lattice is always distorted from the unstrained state, unless there is no anisotropy.

"Magnetostriction" refers to the changes in dimension of a magnetic material when it is placed in magnetic field. It is caused by the rotation of domains of a magnetic material under the action of magnetic field. The rotation of domains gives rise to internal strains in the material, causing its contraction or expansion.

The requirements for high areal density impose increasingly greater requirements on magnetic recording media in terms of coercivity, remanent squareness, low medium noise and narrow track recording performance. It is extremely difficult to produce a magnetic recording medium satisfying such demanding requirements, particularly a high-density magnetic rigid disk medium for longitudinal and perpendicular recording. The magnetic anisotropy of longitudinal and perpendicular recording media causes the easily magnetized direction of the media to be located in the film plane and perpendicular to the film plane, respectively. The remanent magnetic moment of the magnetic media after magnetic recording or writing of longitudinal and perpendicular media is located in the film plane and perpendicular to the film plane, respectively.

A substrate material conventionally employed in producing magnetic recording rigid disks comprises an aluminum-magnesium (Al—Mg) alloy. Such Al—Mg alloys are typically electrolessly plated with a layer of NiP at a thickness of about 15 microns to increase the hardness of the substrates, thereby providing a suitable surface for polishing to provide the requisite surface roughness or texture.

Other substrate materials have been employed, such as glass, e.g., an amorphous glass, glass-ceramic material which comprises a mixture of amorphous and crystalline materials, and ceramic materials. Glass-ceramic materials do not normally exhibit a crystalline surface. Glasses and glass-ceramics generally exhibit high resistance to shocks.

Figure 1:
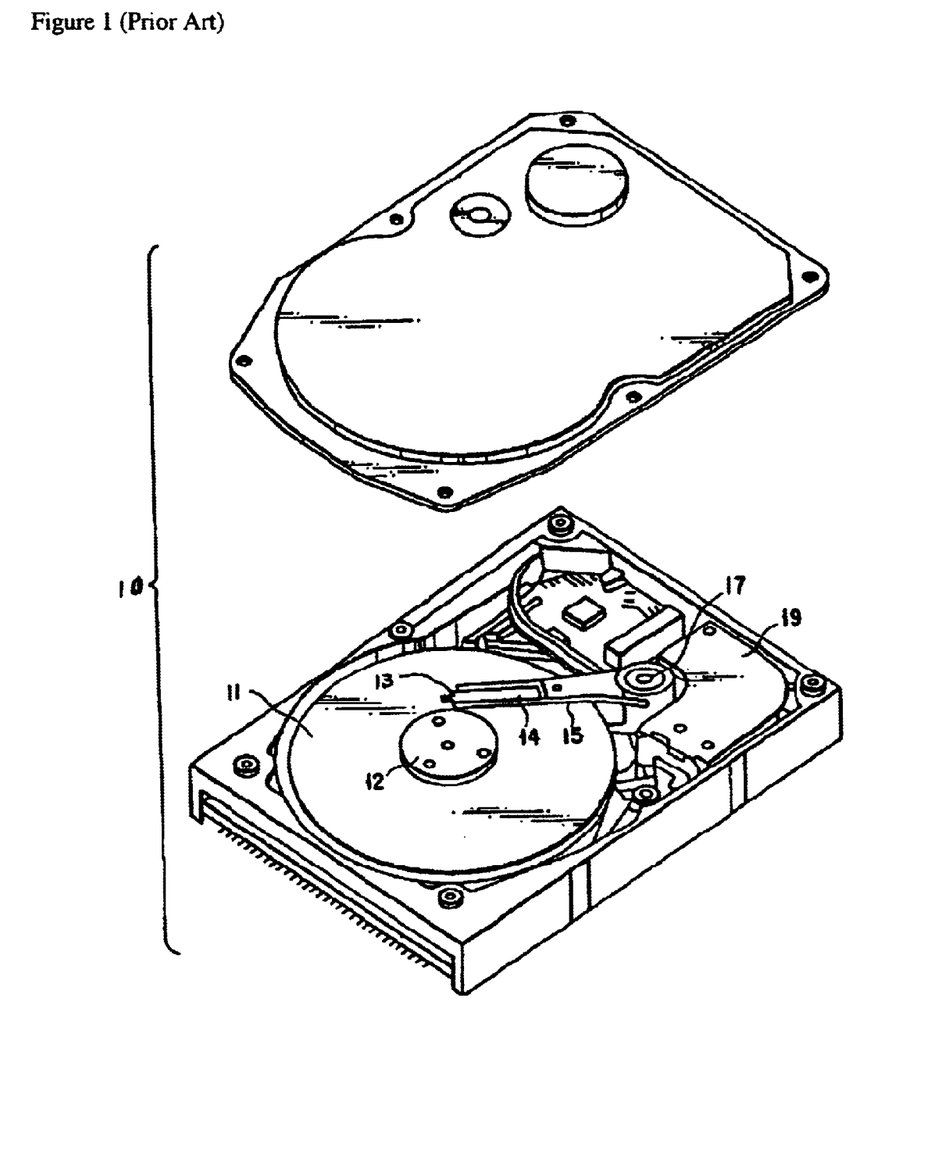
FIG. 1 is a view of a magnetic disk drive.

FIG. 1 shows the schematic arrangement of a magnetic disk drive 10 using a rotary actuator. A disk or medium 11 is mounted on a spindle 12 and rotated at a predetermined speed. The rotary actuator comprises an arm 15 to which is coupled a suspension 14. A magnetic head 13 is mounted at the distal end of the suspension 14. The magnetic head 13 is brought into contact with the recording/reproduction surface of the disk 11. The rotary actuator could have several suspensions and multiple magnetic heads to allow for simultaneous recording and reproduction on and from both surfaces of each medium.

An electromagnetic converting portion (not shown) for recording/reproducing information is mounted on the magnetic head 13. The arm 15 has a bobbin portion for holding a driving coil (not shown). A voice coil motor 19 as a kind of linear motor is provided to the other end of the arm 15. The voice motor 19 has the driving coil wound on the bobbin portion of the arm 15 and a magnetic circuit (not shown). The magnetic circuit comprises a permanent magnet and a counter yoke. The magnetic circuit opposes the driving coil to sandwich it. The arm 15 is swingably supported by ball bearings (not shown) provided at the upper and lower portions of a pivot portion 17. The ball bearings provided around the pivot portion 17 are held by a carriage portion (not shown).

A magnetic head support mechanism is controlled by a positioning servo driving system. The positioning servo driving system comprises a feedback control circuit having a head position detection sensor (not shown), a power supply (not shown), and a controller (not shown). When a signal is supplied from the controller to the respective power supplies based on the detection result of the position of the magnetic head 13, the driving coil of the voice coil motor 19 and the piezoelectric element (not shown) of the head portion are driven.

Figure 2:
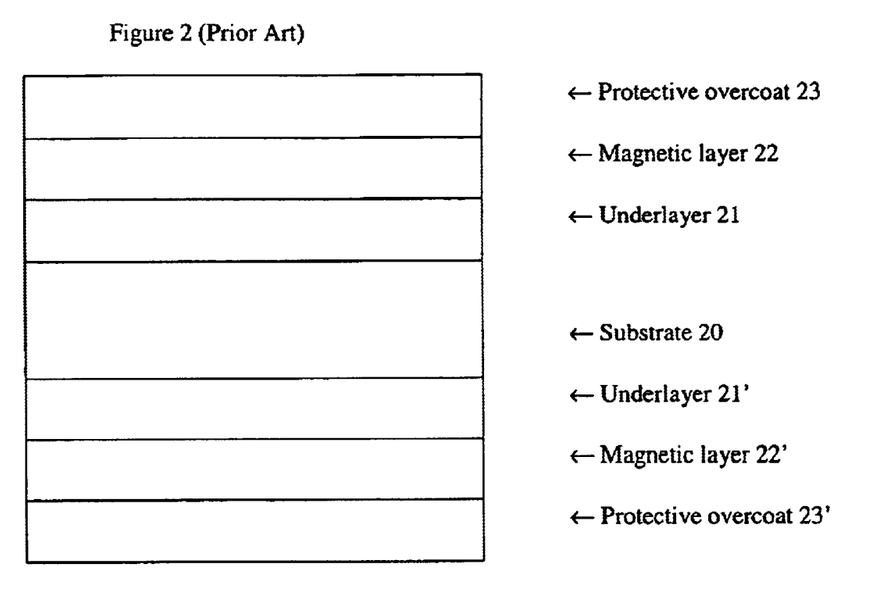
FIG. 2 is a schematic representation of the film structure in accordance with a magnetic recording medium of the prior art.

A cross sectional view of a conventional longitudinal recording disk medium is depicted in FIG. 2. A longitudinal recording medium typically comprises a non-magnetic substrate 20 having sequentially deposited on each side thereof an underlayer 21, 21', such as chromium (Cr) or Cr-alloy, a magnetic layer 22, 22', typically comprising a cobalt (Co)-base alloy, and a protective overcoat 23, 23', typically containing carbon. Conventional practices also comprise bonding a lubricant topcoat (not shown) to the protective overcoat. Underlayer 21, 21', magnetic layer 22, 22', and protective overcoat 23, 23', are typically deposited by sputtering techniques. The Co-base alloy magnetic layer deposited by conventional techniques normally comprises polycrystallites epitaxially grown on the polycrystal Cr or Cr-alloy underlayer.

The underlayer and magnetic layer are conventionally sequentially sputter deposited on the substrate in an inert gas atmosphere, such as an atmosphere of pure argon. A conventional carbon overcoat is typically deposited in argon with nitrogen, hydrogen or ethylene. Conventional lubricant topcoats are typically about 20 Å thick.

It is recognized that the magnetic properties, such as Hr, Mr, S* and SMNR, which are critical to the performance of a magnetic alloy film, depend primarily upon the microstructure of the magnetic layer which, in turn, is influenced by one or more underlying layers on which it is deposited. It is also recognized that an underlayer made of soft magnetic films is useful in perpendicular recording media because a relatively thick (compared to magnetic layer) soft underlayer provides a return path for the read-write head and amplifies perpendicular component of the write field in the recording layer. However, Barkhausen noise caused by domain wall motions in the soft underlayer can be a significant noise source. Since the orientation of the domains can be controlled by the magnetic anisotropy, introducing a magnetic anisotropy in the soft underlayer would be one way to suppress Barkhausen noise. When the magnetic anisotropy is sufficiently large, the domains would preferably orient themselves along the anisotropy axis.

The magnetic anisotropy could be controlled in several ways in the soft magnetic thin film materials. The most frequently applied methods are post-deposition annealing while applying a magnetic field and applying a bias magnetic field during deposition. However, both methods can cause complications in the disk manufacturing process.

A "soft magnetic" material is material that is easily magnetized and demagnetized. As compared to a soft magnetic material, a "hard magnetic" material is one that neither magnetizes nor demagnetizes easily. The problem of making soft magnetic materials conventionally is that they usually have many crystalline boundaries and crystal grains oriented in many directions. In such metals, the magnetization process is accompanied by much irreversible Block wall motion and by much rotation against anisotropy, which is usually irreversible. See *Mc-Graw Hill Encyclopedia of Science & Technology*, Vol. 5, 366 (1982). *Mc-Graw Hill Encyclopedia of science & Technology* further states that the preferred soft material would be a material fabricated by some inexpensive technique that results in all crystal grains being oriented in the same or nearly the same direction. Id. Applicants, however, have found that "all grains" oriented in the same direction would be very difficult to produce and would not be the "preferred soft material." In fact, applicants have found that very high anisotropy is not desirable.

Li-Lien Lee et al., "Seedlayer induced (002) crystallographic texture in NiAl underlayers," *J. Appl. Phys.* 79 (8), (1996), and U. S. Pat. No. 6,077,586 disclose the use of seedlayer to control structure of non-ferromagnetic underlayers of longitudinal recording media.

This invention describes how one can create magnetic anisotropy in soft underlayer of a perpendicular recording media by using a seedlayer to maximize the effect of a magnetron field.

SUMMARY OF THE INVENTION

The invention provides a perpendicular magnetic recording medium having high areal recording density exhibiting low noise. One way of achieving this goal is to produce a soft magnetic film in the perpendicular magnetic recording medium with an easy axis substantially directed in a transverse direction to a traveling direction of a read-write head.

One embodiment is a recording device for perpendicular recording comprising a magnetic head and a recording medium, the recording medium comprising a substrate, a seedlayer on the substrate and a soft magnetic underlayer on the seedlayer, the underlayer comprising an easy axis of magnetization directed in a direction substantially transverse to a traveling direction of the magnetic head. The soft-underlayer could comprise a substantially radial or transverse anisotropy.

The underlayer could comprise a soft magnetic material. The underlayer provides a return path for a recording head. The underlayer could also amplify a perpendicular component of a write field in a recording layer overlying the underlayer. It is not required to use a material with low magnetostriction for the underlayer to take advantage of this invention. What is required is a seedlayer that can change the magnetostriction of the underlayer, so that the radial anisotropy induced by magnetron field can be dominant or anisotropy caused by magnetostriction is in radial direction. The underlayer could comprise a material selected from the group consisting of a permalloy, a CoZrNb alloy, a NiFe alloy, a FeCoB alloy and a FeAlN alloy. The recording medium could be a disk, a tape or any other device capable of recording data.

In one embodiment, the underlayer has the easy axis of magnetization induced by a magnetron field, the seedlayer could comprise a material selected from the group consisting of CoCr and a CoCr-alloy, and the thickness of the underlayer could be about 200–400 nm.

Another embodiment is a method for manufacturing a magnetic recording disk for perpendicular recording, comprising applying a magnetron field, depositing a seedlayer on a substrate and depositing an underlayer on the seedlayer, wherein the underlayer could comprise an easy axis of magnetization directed in a radial direction of the magnetic recording disk. The method could further comprise heating the substrate. The step of depositing an underlayer could be by sputtering, wherein the sputtering could be a reactive sputtering. In one variation, the substrate is kept stationary during the depositing a magnetic underlayer, wherein a diameter of a magnetron source producing the magnetron field is larger than a diameter of the substrate. In another variation, the substrate is rotated during the depositing a magnetic underlayer, wherein a size of a magnetron source producing the magnetron field is smaller or comparable to a diameter of the substrate and the substrate is placed off-center with respect to the magnetron source.

Yet another embodiment is a magnetic recording disk for perpendicular recording, comprising a substrate and means for providing a return path for a recording head. In this invention, means for providing a return path for a recording head comprises a soft magnetic layer having an easy axis of magnetization directed in a radial direction of the magnetic recording disk or directed in a transverse direction of a traveling direction of a magnetic head traveling over a tape or disk during a read-write operation. Also, in this invention, means for inducing a substantially radial or transverse anisotropy in the underlayer could be a seedlayer located adjacent to the underlayer.

As will be realized, this invention is capable of other and different embodiments, and its details are capable of modifications in various obvious respects, all without departing from this invention. Accordingly, the drawings and description are to be regarded as illustrative in nature and not as restrictive.

DETAILED DESCRIPTION

Figure 3:
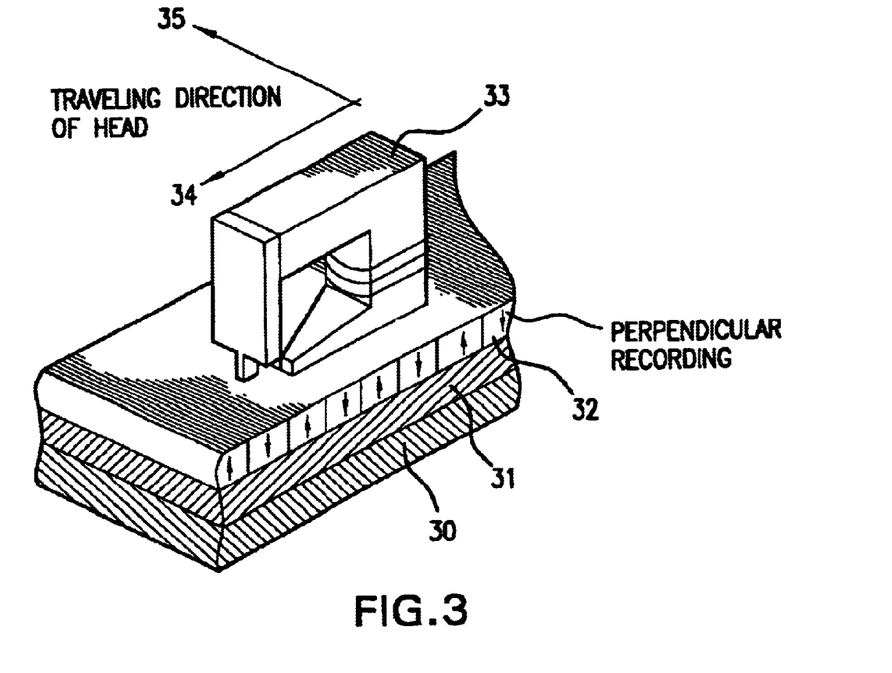
FIG. 3 is perspective view of a magnetic head and a magnetic disk of a perpendicular recording disk medium.

A perpendicular recording disk medium, shown in FIG. 3, is similar to the longitudinal recording medium depicted in FIG. 2, but with the following differences. First, a perpendicular recording disk medium has soft magnetic underlayer 31 of an alloy such as Permalloy instead of a Cr-containing underlayer. Second, as shown in FIG. 3, magnetic layer 32 of the perpendicular recording disk medium comprises domains oriented in a direction perpendicular to the plane of the substrate 30. Also, shown in FIG. 3 are the following: (a) read-write head 33 located on the recording medium, (b) traveling direction 34 of head 33 and (c) transverse direction 35 with respect to the traveling direction 34.

This invention provides magnetic recording media suitable for high areal recording density exhibiting high SMNR. This invention achieves such technological advantages by forming a substantially radial anisotropy in a soft underlayer. The underlayer is "soft" because it made of a soft magnetic material and it is called an "underlayer" because it resides under a recording layer. When soft underlayers are fabricated by magnetron sputtering on disk substrates, there are several components competing to determine the net anisotropy of the underlayers: effect of magnetron field, magnetostriction of film and stress originated from substrate shape, etc. Although the effect of magnetron field is not easy to be controlled without changing the design of equipment, the effect of magnetostriction and stress is very easy to be controlled by changing the sputtering conditions.

A seedlayer is a layer lying in between the substrate and the underlayer. Proper seedlayer can also control anisotropy of the soft underlayer by promoting microstructure that exhibit either short-range ordering under the influence of magnetron field or different magnetostriction. A seedlayer could also alter local stresses in the soft underlayer. Thus, one embodiment of this invention relates to a method of inducing radial anisotropy in soft underlayers by seedlayer.

In a preferred embodiment, a magnetron field produces the radial anisotropy in the soft underlayer. In a magnetron, electrons generated from a heated cathode move under the combined force of a radial electric field and an axial magnetic field. By its structure, a magnetron causes moving electrons to interact synchronously with traveling-wave components of a microwave standing-wave pattern in such a manner that electron potential energy is converted to microwave energy with high efficiency.

The magnetron is a device of essentially cylindrical symmetry. On the central axis is a hollow cylindrical cathode. The outer surface of the cathode carries electron-emitting materials, primarily barium and strontium oxides in a nickel matrix. Such a matrix is capable of emitting electrons when current flows through the heater inside the cathode cylinder.

At a radius somewhat larger than the outer radius of the cathode is a concentric cylindrical anode. The anode serves two functions: (1) to collect electrons emitted by the cathode and (2) to store and guide microwave energy. The anode comprises a series of quarter-wavelength cavity resonators symmetrically arranged around the cathode.

A radial dc electric field (perpendicular to the cathode) is applied between cathode and anode. This electric field and the axial magnetic field (parallel and coaxial with the cathode) introduced by pole pieces at either end of the cathode, as described above, provide the required crossed-field configuration.

The phrase "an easy axis of magnetization directed in a direction substantially transverse to a traveling direction of the magnetic head" means that the easy axis of magnetization is directed more toward a direction transverse to the traveling direction of the read-write head than toward the traveling direction. Also, the phrase "a substantially radial or transverse anisotropy" means that the domains of the soft magnetic material of the underlayer are directed more toward a direction transverse to the traveling direction of the read-write head than toward the traveling direction.

Typically, when a magnetic recording medium is a tape, the tape travels and the head is stationary. Therefore, "a traveling direction of the magnetic head" of a stationary head of a recording device in which the magnetic recording tape moves is the direction in which the head "travels" spatially with respect to the magnetic recording tape.

In one embodiment of this invention, fixed magnetron sources with inner-and-outer magnet poles are used in a single disk type sputtering machine. Shunts are placed in the gap between the inner and outer magnet poles. Soft magnetic films with low magnetostriction are sputtered using the above magnetron sources on super-smooth or textured disk substrates having a seedlayer on the surface of the substrates. The disk substrates are kept either stationary (Case I) or rotating (Case II), depending upon the relative size of the magnetron source and the disk substrate. In Case I, the diameter of the source is larger than that of disks, and disks are concentric with the source during sputtering. In Case II, the size of magnetron source is smaller or comparable to that of the disk, and vertical distance between the source and substrate is relatively small.

Figure 4:
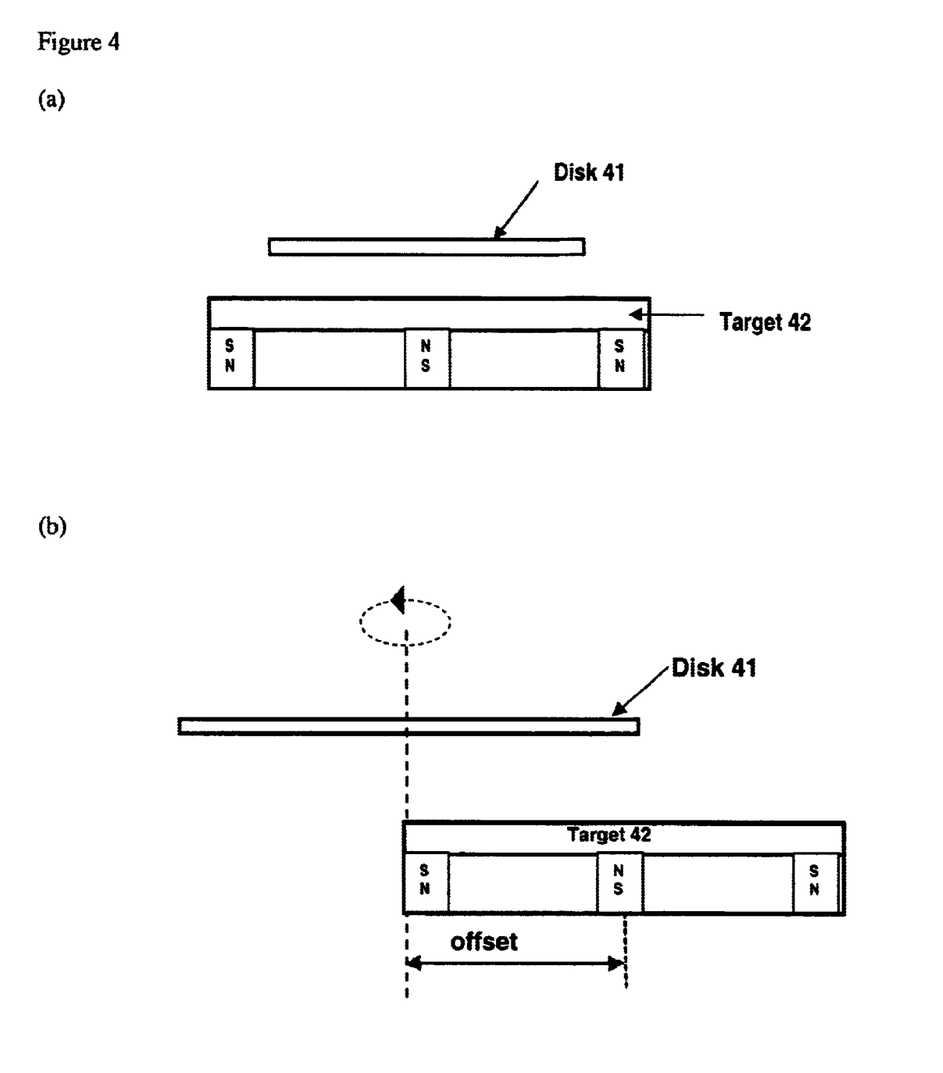
FIGS. 4a and 4b are schematic diagrams of a magnetron source and disk substrate in embodiments of this invention showing a fixed magnetron source centered and off-centered from the center of a rotating disk substrate.

A disk substrate 41 is placed centered (FIG. 4a) and off-centered (FIG. 4b) with a target 42, to minimize stress in the films. In FIG. 4a, the magnet array in the circular magnetron is symmetrical and the disk and magnetron are in concentric geometry. Therefore, no relative motion between magnetron and disk substrate is required. In another variation of the method shown in FIG. 4a, the magnet array in circular magnetron can be asymmetrical. Thus either the disk or magnetron should be rotated to provide a radial field to the disk. However, as shown in FIG. 4b, even if the disk is off-centered from the magnetron, a net field can be applied in the radial direction of the disk when the disk is rotated. Offset should be adjusted to obtain a radial field on the whole disk, depending upon size of disk, magnetron pack and magnetron field profile.

Applicants recognized that the soft-underlayers manufactured according to the current methods have radial magnetic anisotropy induced by a field and altered magnetostriction by seedlayer by considering all possible origins of magnetic anisotropy:

(1) Magnetocrystalline anisotropy: Sputtered thin films listed as examples in this application form polycrystalline microstructure. Crystallographic orientation of micro-crystals in the films is random in the plane of disk. There is no reason why they form differently in radial and circumferential direction. Therefore, the disks of this invention do not have Magnetocrystalline anisotropy.

(2) Shape anisotropy: This also does not explain the anisotropy between radial and circumferential direction of the disks of this invention.

(3) Stress anisotropy: Magnetostriction can cause stress-induced anisotropy.

(4) External field induced anisotropy: When an external magnetic field is applied during film deposition, it can create short-range ordering that produces magnetic anisotropy in the direction of applied field. This method is used in manufacturing a read-write head of a recording medium. Similarly, this invention utilizes a magnetron field to apply a field in the radial direction of disks to produce radial anisotropy.

In accordance with embodiments of this invention, the substrates that may be used in the invention include glass, glass-ceramic, NiP/aluminum, metal alloys, plastic/polymer material, ceramic, glass-polymer, composite materials or other non-magnetic materials.

Figure 5:
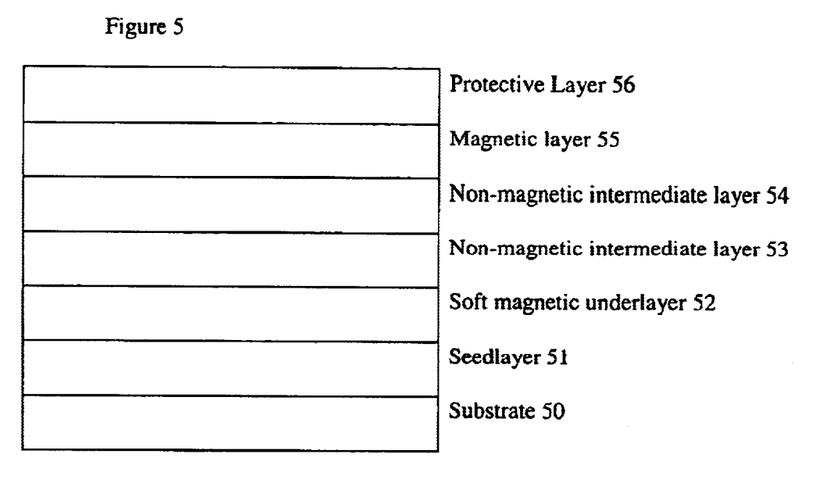
FIG. 5 is a schematic representation of the film structure in accordance with a magnetic recording medium of this invention.

A preferred embodiment of a perpendicular recording medium of this invention is shown in FIG. 5. The thickness of seedlayer 51 is about 0.1–20 nm, preferably, about 3–8 nm. The thickness of soft magnetic underlayer 52 is about 200–400 nm, and the thickness of magnetic layer 55 deposited on the underlayer is about 20 nm. In between the soft magnetic underlayer 52 and the magnetic layer 55 could be intermediate layers 53 and 54 of thickness of about 5–10 nm. Protective layer 56 typically covers the magnetic layer 55.

A perpendicular recording medium of this invention comprises a soft underlayer and a recording layer. A soft underlayer should preferably be made of soft magnetic materials and the recording layer should preferably be made of hard magnetic materials. A soft underlayer is relatively thick compared to other layers. Any layers between the soft underlayer and the recording layer is called interlayer or intermediate layer. An interlayer can be made of more than one layer of non-magnetic materials. The purpose of the interlayer is to prevent an interaction between the soft magnetic underlayer and recording layer. An interlayer could also promote the desired properties of the recording layer. Conventional (longitudinal) media do not have a soft magnetic underlayer. Therefore, the layers named as "underlayer," "seed layer," "sub-seed layer," or "buffer layer" of longitudinal media are somewhat equivalent to the intermediate layer(s) of perpendicular media.

Figure 6:
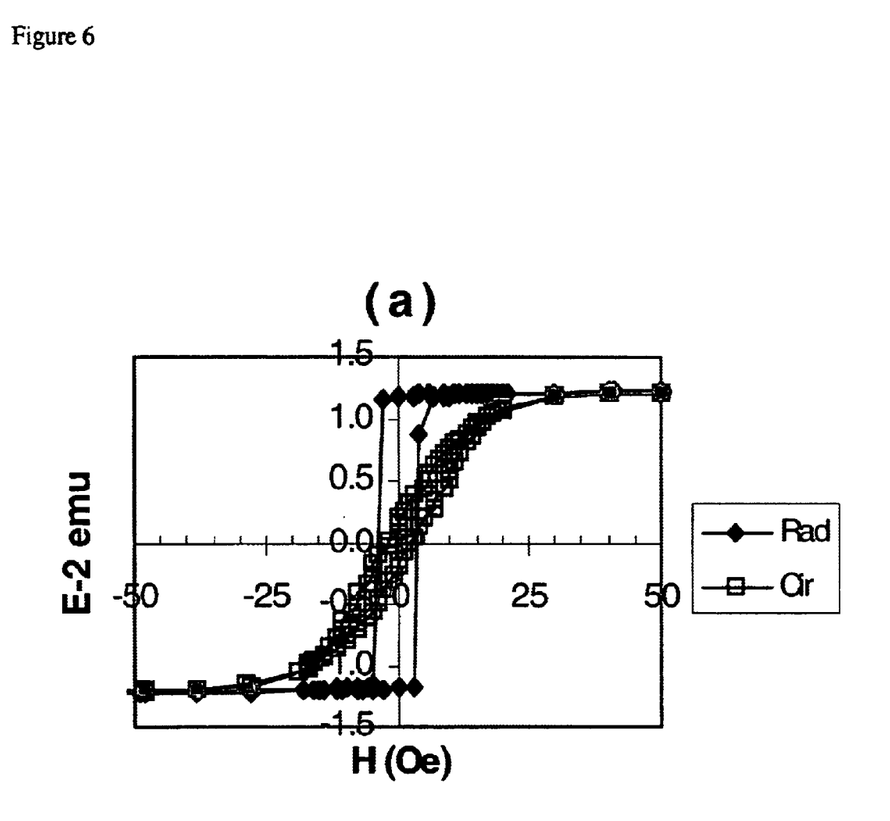
FIG. 6 shows hysteresis loops of a NiFe40 film deposited on a CoCr40 seedlayer. The hysteresis loops were measured in radial and circumferential directions using a DMS vector VSM.
Figure 7:
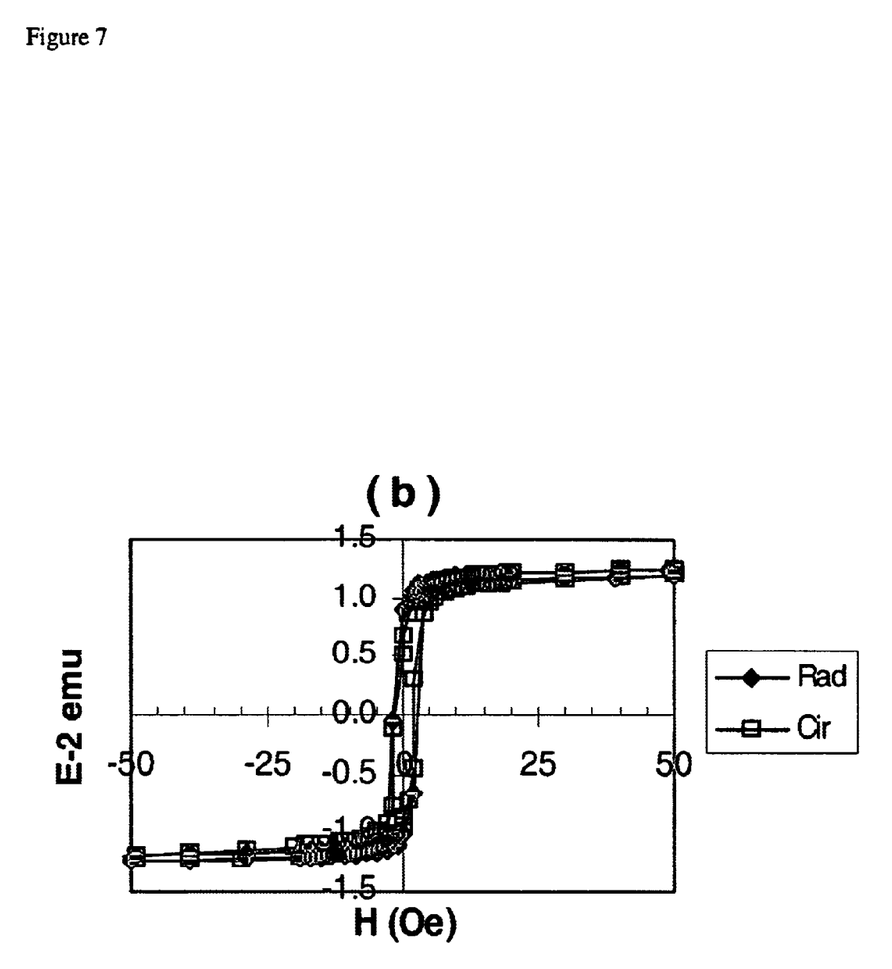
FIG. 7 shows the hysteresis loops of a NiFe40 film with no CoCr40 seedlayer underneath the NiFe40 film. The hysteresis loops were measured in radial and circumferential directions using a DMS vector VSM.

"Anisotropy" in the examples below was determined as follows. First, the hysteresis loops of the soft underlayer material were measured along both the radial and circumferential directions of the magnetic recording disk. For example, FIGS. 6 and 7 show representative hysteresis loops of the two soft underlayer materials of Example 1 and Comparative Example 1, discussed below. From FIG. 6 one can see that external field of about less than 5 Oe can saturate the underlayer used in the disk of example of FIG. 6 when a field is applied in the radial direction, while about 25 Oe is necessary to saturate the sample in circumferential direction. In other words, it is easier to saturate the sample in radial direction than in circumferential direction. Thus, radial and circumferential directions are called the easy and hard axis, respectively.

The underlayers of the disks whose hysteresis loops are shown in FIG. 6 also have radial anisotropy. If there would be no anisotropy, the hysteresis loops for the radial and circumferential directions would superimpose on each other. The fact that these two hysteresis loops do not superimpose over one another indicates that the magnetic underlayer material has anisotropy. With reference to the hysteresis loops of FIG. 6, "anisotropy" is determined as follows.

(1) A straight line that goes through the origin and represents the slope of the initial portion of the hard axis hysteresis loop passing through or near the origin is drawn.

(2) The saturated part of the easy axis hysteresis loop is extended until it intersects with the line drawn in step (1).

(3) The field that corresponds to the intersection of the two lines drawn in steps (1) and (2) is called Hk and it is a measure of the radial anisotropy of the soft magnetic underlayer sample.

In particular, the soft magnetic underlayer of the disk whose hysteresis loops are shown in FIG. 6 have a radial anisotropy value of 20 Oe.

EXAMPLES

All samples described in this disclosure were fabricated with DC magnetron sputtering except carbon films were made with AC magnetron sputtering.

Example I

A single-disk type of sputtering machine with multi-vacuum chambers was used for fabricating NiFe alloy underlayers as shown in FIG. 4a. The diameter of magnetron source and disk were 7 inch and 84 mm, respectively. The CoCr40 seedlayers with 4–8 nm thickness were deposited on either heated or unheated disk substrates prior to deposition of NiFe films. The NiFe films were sputtered in argon gas pressure of 3 to 6 mtorr using 1 to 4 kW DC power. A fixed magnetron source was co-centric with disks during sputtering. The hysteresis loops of a 200 nm thick NiFe40 film deposited on 8 nm thick CoCr seedlayer, measured in radial and circumferential direction using a DMS vector VSM, are shown in FIG. 6. A "DMS vector VSM" is Model 10 VSM provided by Digital Measurement Systems. It is called vector VSM because the direction of field can be changed arbitrary with respect to sample.

The particular NiFe film of the disk whose hysteresis loop is shown in FIG. 6 was sputtered on unheated disk substrate by applying 1.5 kW power at argon pressure of 6 mtorr.

Comparative Example 1

Hysteresis loops of the films sputtered under the same conditions without the seedlayer are shown in FIG. 7 for comparison. While the soft underlayer film of Example 1 with CoCr40 seedlayer showed radial anisotropy, the film of Comparative Example 1 without the seedlayer is isotropic.

By this invention, radial magnetic anisotropy can be induced in soft underlayer films deposited on disk substrates by using a CoCr40 seedlayer. The seedlayer thickness is nominally up to 20 nm, typically 3–8 nm. This layer can be sputtered with and without heat.

By this invention, radial magnetic anisotropy can be induced in soft underlayer films deposited on disk substrates by using a fixed pole DC-magnetron sputtering source. Magnetostriction effects on the anisotropy need to be minimized or altered to be in radial direction by choosing materials with low magnetostriction, or adjusting sputtering conditions e.g., by sputtering a seedlayer.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein.

This application discloses several numerical range limitations. Persons skilled in the art would recognize that the numerical ranges disclosed inherently support any range within the disclosed numerical ranges even though a precise range limitation is not stated verbatim in the specification because this invention can be practiced throughout the disclosed numerical ranges. A holding to the contrary would "let form triumph over substance" and allow the written description requirement to eviscerate claims that might be narrowed during prosecution simply because the applicants broadly disclose in this application but then might narrow their claims during prosecution. Finally, the entire disclosure of the patents and publications referred in this application are hereby incorporated herein by reference.

What is claimed is:

1. A recording device for perpendicular recording comprising a magnetic head and a recording medium,
   the recording medium comprising a substrate, a non-magnetic CoCr seedlayer on the substrate, a soft magnetic underlayer on the seedlayer and a perpendicular magnetic recording layer,
   the underlayer comprising an easy axis of magnetization directed in a direction substantially transverse to a traveling direction of the magnetic head,
   wherein the underlayer without the seedlayer is isotropic and the seedlayer induces anisotropy in the underlayer, said anisotropy being in the easy axis of magnetization directed in the direction substantially transverse to the traveling direction of the magnetic head.

2. The recording device of claim 1, wherein the recording medium comprises a substantially radial or transverse anisotropy.

3. The recording device of claim 1, wherein the underlayer provides a return path for a recording head.

4. The recording device of claim 3, wherein the underlayer amplifies a perpendicular component of a write field in a recording layer overlying the underlayer.

5. The recording device of claim 1, wherein the seedlayer can change the magnetostriction of the underlayer.

6. The recording device of claim 1, wherein the underlayer comprises a material selected from the group consisting of a permalloy, a FeCoB alloy, a NiFe alloy and a FeAlN alloy.

7. The recording device of claim 1, wherein the recording medium is selected from the group consisting of a disk and a tape.

8. The recording device of claim 1, wherein the seedlayer comprises a material selected from the group consisting of CoCr and a CoCr-alloy.

9. The recording device of claim 1, wherein a thickness of the underlayer is about 200–400 nm.

10. A method for manufacturing a magnetic recording disk for perpendicular recording of claim 1, comprising:
    applying a magnetron field
    depositing a seedlayer on a substrate and
    depositing an underlayer on a seedlayer,
    wherein the underlayer comprises an easy axis of magnetization directed in a radial direction of the magnetic recording disk.

11. The method of claim 10, further comprising heating the substrate.

12. The method of claim 10, wherein the depositing an underlayer is by sputtering.

13. The method of claim 12, wherein the sputtering is a reactive sputtering.

14. The method of claim 10, wherein the substrate is kept stationary during said depositing a magnetic underlayer.

15. The method of claim 14, wherein a diameter of a magnetron source producing the magnetron field is larger than a diameter of the substrate.

16. The method of claim 10, wherein the substrate is rotated during said depositing a magnetic underlayer.

17. The method of claim 16, wherein a size of a magnetron source producing the magnetron field is smaller or comparable to a diameter of the substrate.

18. The method of claim 17, wherein the substrate is placed off-center with respect to the magnetron source.

19. A disk drive comprising a magnetic recording disk for perpendicular recording, wherein the magnetic recording disk comprises a substrate, a non-magnetic CoCr seedlayer, a soft magnetic underlayer on the substrate and a perpendicular magnetic recording layer, wherein the underlayer comprises an easy axis of magnetization directed in a radial direction of the magnetic recording disk, wherein the underlayer without the seedlayer is isotropic and the seedlayer induces radial anisotropy in the underlayer.

20. A magnetic recording disk for perpendicular recording comprising a substrate, a non-magnetic CoCr seedlayer on the substrate, a soft magnetic underlayer on the seedlayer and a perpendicular magnetic recording layer, wherein the underlayer without the seedlayer is isotropic and the seedlayer induces radial anisotropy in the underlayer.

* * * * *